(12) United States Patent
Sakui (10) Patent No.: US 9,734,915 B2
(45) Date of Patent: *Aug. 15, 2017

(54) SHIELDED VERTICALLY STACKED DATA LINE ARCHITECTURE FOR MEMORY

(71) Applicant: Micron Technology, Inc., Boise, ID (US)

(72) Inventor: Koji Sakui, Setagayaku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/867,948

(22) Filed: Sep. 28, 2015

(65) Prior Publication Data

US 2016/0019970 A1    Jan. 21, 2016

Related U.S. Application Data

(63) Continuation of application No. 13/919,599, filed on Jun. 17, 2013, now Pat. No. 9,147,493.

(51) Int. Cl.
*G11C 16/04* (2006.01)
*G11C 16/24* (2006.01)
(Continued)

(52) U.S. Cl.
CPC ............... *G11C 16/24* (2013.01); *G11C 7/12* (2013.01); *G11C 16/0483* (2013.01);
(Continued)

(58) Field of Classification Search
CPC ............. G11C 16/24; G11C 7/12; G11C 7/18
(Continued)

(56) References Cited

U.S. PATENT DOCUMENTS 5,453,955 A    9/1995  Sakui et al.
7,243,185 B2   7/2007  See et al.
(Continued)

FOREIGN PATENT DOCUMENTS

CN       104813406 A    7/2015
KR    1020110132820 A   12/2011
(Continued)

OTHER PUBLICATIONS

"A 34 MB/s MLc Write Throughput 16 Gb Nand With All Bit Line Architecture on 56 nm Technology", IEEE Journal of Solid-State Circuits, 44(1), (Jan. 2009), 186-193.

(Continued)

*Primary Examiner* — Pho M Luu
(74) *Attorney, Agent, or Firm* — Schwegman Lundberg & Woessner, P.A.

(57) ABSTRACT

Apparatuses and methods include an apparatus that includes first and second strings of vertically stacked memory cells, and first and second pluralities of vertically stacked data lines, and the use thereof. A data line of the first plurality of data lines is coupled to the first string through a first select device. A data line of the second plurality of data lines is coupled to the second string through a second select device and is adjacent to the data line coupled to the first string. Such an apparatus can be configured to couple the data line coupled to the first string to a shield potential during at least a portion of a memory operation involving a memory cell of the second string.

20 Claims, 11 Drawing Sheets

(51) Int. Cl.
*G11C 16/34* (2006.01)
*G11C 7/12* (2006.01)
*G11C 16/10* (2006.01)
*G11C 7/18* (2006.01)

(52) U.S. Cl.
CPC .......... *G11C 16/10* (2013.01); *G11C 16/3427* (2013.01); *G11C 7/18* (2013.01)

(58) Field of Classification Search
USPC .............................. 365/187.17, 226, 185.18
See application file for complete search history.

(56) References Cited

U.S. PATENT DOCUMENTS

| | | | |
|---|---|---|---|
| 7,355,237 B2 | 4/2008 | Lutze et al. | |
| 7,807,533 B2 | 10/2010 | Lutze et al. | |
| 8,294,131 B2* | 10/2012 | Kim | H01L 27/10876 257/2 |
| 8,441,855 B2* | 5/2013 | Liu | G11C 16/0483 365/185.01 |
| 8,614,918 B2 | 12/2013 | Sakui | |
| 8,619,471 B2 | 12/2013 | Tanzawa | |
| 8,780,631 B2 | 7/2014 | Tanzawa | |
| 8,811,084 B2 | 8/2014 | Tanzawa | |
| 8,902,663 B1* | 12/2014 | Or-Bach | G11C 16/02 365/185.08 |
| 9,036,421 B2* | 5/2015 | Liu | H01L 27/11565 365/185.01 |
| 9,093,152 B2 | 7/2015 | Sakui et al. | |
| 9,147,493 B2* | 9/2015 | Sakui | G11C 16/3427 |
| 2005/0180186 A1* | 8/2005 | Lutze | G11C 11/5628 365/53 |
| 2007/0158736 A1 | 7/2007 | Arai et al. | |
| 2008/0084729 A1 | 4/2008 | Cho et al. | |
| 2008/0157169 A1* | 7/2008 | Yuan | G11C 16/3418 257/319 |
| 2008/0160680 A1* | 7/2008 | Yuan | H01L 27/11568 438/129 |
| 2009/0238005 A1 | 9/2009 | You | |
| 2010/0322000 A1 | 12/2010 | Shim et al. | |
| 2011/0002178 A1 | 1/2011 | Hwang et al. | |
| 2011/0266604 A1 | 11/2011 | Kim et al. | |
| 2011/0299314 A1 | 12/2011 | Samachisa et al. | |
| 2012/0001249 A1 | 1/2012 | Alsmeier et al. | |
| 2012/0044733 A1 | 2/2012 | Scheuerlein | |
| 2012/0063231 A1 | 3/2012 | Wood et al. | |
| 2012/0257433 A1 | 10/2012 | Yan et al. | |
| 2014/0119117 A1 | 5/2014 | Sakui et al. | |
| 2014/0369116 A1 | 12/2014 | Sakui | |
| 2015/0162084 A1 | 6/2015 | Morooka et al. | |
| 2015/0333001 A1 | 11/2015 | Sakui et al. | |

FOREIGN PATENT DOCUMENTS

| | | |
|---|---|---|
| TW | 201432693 A | 8/2014 |
| WO | WO-2014066837 A1 | 5/2014 |

OTHER PUBLICATIONS

"U.S. Appl. No. 13/661,498, Final Office Action dated Jan. 2, 2015", 18 pgs.
"U.S. Appl No. 13/661,498, Non Final Office Action dated Jul. 8, 2014", 14 pgs.
"U.S. Appl No. 13/661,498, filed Oct. 8, 2014 to Non Final Office Action dated Jul. 8, 2014", 13 pgs.
"U.S. Appl No. 13/661,498, Response to Office Action dated Jan. 2, 2015", 14 pgs.
"U.S. Appl No. 14/810,044, Non Final Office Action dated Jul. 25, 2016", 15 pgs.
"U.S. Appl No. 14/810,044, filed Oct. 25, 2016 to Non Final Office Action dated Jul. 25, 2016", 12 pgs.
"International Application Serial No. PCT/US2013/066941, International Preliminary Report on Patentability dated May 7, 2015", 9 pgs.
"International Application Serial No. PCT/US2013/066941, International Search Report dated Feb. 10, 2014", 3 pgs.
"International Application Serial No. PCT/US2013/066941, Written Opinion dated Feb. 10, 2014", 7 pgs.
Nakano, H, et al., "A dual layer bitline DRAM array with Vcc/Vss hybrid precharge for multi-gigabit DRAMS", Symposium on VLSI Circuits, Digest of Technical Papers., (Jun. 1996).
"U.S. Appl No. 14/810,044, Final Office Action dated Mar. 3, 2017", 15 pgs.

* cited by examiner

SHIELDED VERTICALLY STACKED DATA LINE ARCHITECTURE FOR MEMORY

PRIORITY APPLICATION

This application is a continuation of U.S. application Ser. No. 13/919,599, filed Jun. 17, 2013, now issued as U.S. Pat. No. 9,147,493, which is incorporated herein by reference in its entirety.

TECHNICAL FIELD

The present embodiments relate generally to memory and a particular embodiment relates to shielded vertically stacked data line architecture for memory.

BACKGROUND

Flash memory devices have developed into a popular source of non-volatile memory for a wide range of electronic applications. Common uses for flash memory include personal computers, personal digital assistants (PDAs), digital cameras, digital media players, digital recorders, games, appliances, vehicles, wireless devices, cellular telephones, and removable memory modules. Flash memory devices typically use a one-transistor memory cell that allows for high memory densities, high reliability, and low power consumption. Changes in threshold voltage of the cells, through programming of a charge storage structure, such as floating gates, trapping layers or other physical phenomena, determine the data state of each cell.

Electronic devices that use memory are continually being designed faster, smaller and more power efficient. In order to remain competitive, memory device manufacturers also have a continual need to increase memory operation speed and reduce the power consumption of memory devices.

DETAILED DESCRIPTION

For the purposes of this document, an "apparatus" can refer to any of a number of structures, such as circuitry, a device or a system. A transistor is described as being enabled to assume an activated state when it is rendered conductive by a control gate voltage that is separated from its source voltage by at least its threshold voltage. The transistor is described as being disabled to assume an inactive state when the difference between the control gate voltage and the source voltage is less than the threshold voltage, so that the transistor is rendered non-conductive. A "potential" is an electrical voltage. Multiple memory cells can be read at the same time during a page read operation where a "page" includes a fixed amount of data, such as two kilobytes of data, within a memory device.

Figure 1:
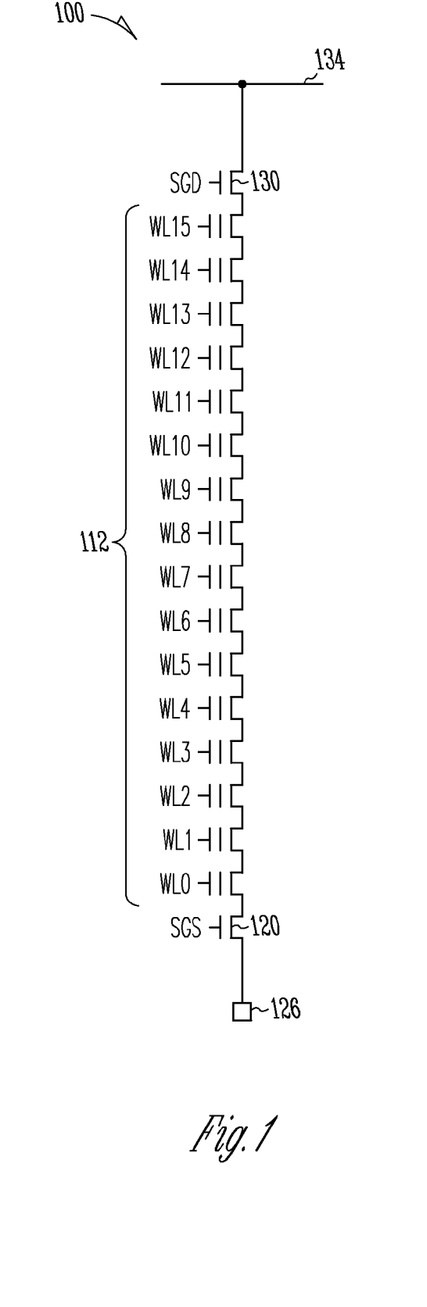
FIG. 1 shows a schematic diagram of one embodiment of a string of memory cells.

FIG. 1 is a schematic diagram of a string 100 of vertically stacked memory cells formed above a substrate (not shown). For purposes of illustration only, the string 100 is shown having 16 memory cells 112 formed in 16 memory cell tiers (e.g., layers) above the substrate. Alternate embodiments can include more or less than 16 memory cells 112 and/or more or less memory cell tiers. The string 100 includes a source select device 120 that may be an n-channel transistor coupled between one of the memory cells 112 at one end of the string 100 and a common source 126. The common source 126 may comprise, for example, a slot of commonly doped semiconductor material and/or other conductive material. At the other end of the string 100, a drain select device 130 may be an n-channel transistor coupled between one of the memory cells 112 and a data line (e.g., bit line) 134. The common source 126 can be coupled to a reference voltage $V_{SS}$ (e.g., ground) or a voltage source (e.g., a charge pump circuit not shown).

Each memory cell 112 may comprise, for example, a floating gate transistor or a charge trap transistor and may be a single level charge storage device or a multilevel charge storage device. The memory cells 112, the source select gate transistor 120, and the drain select gate transistor 130 are controlled by signals on their respective control gates, the signals on the control gates of the memory cells 112 being provided on access lines (e.g., word lines) WL0-WL15. In one embodiment, the control gates of memory cells in a row of memory cells can at least partially form an access lines.

The source select gate transistor 120 receives a control signal that controls the source select gate transistor 120 to substantially control conduction between the string 100 and the common source 126. The drain select gate transistor 130 receives a control signal that controls the drain select gate transistor 130, so that the drain select gate transistor 130 can be used to select or deselect the string 100. The string 100 can be one of multiple strings of memory cells in a block of memory cells in a memory device, such as a NAND memory device.

Figure 2:
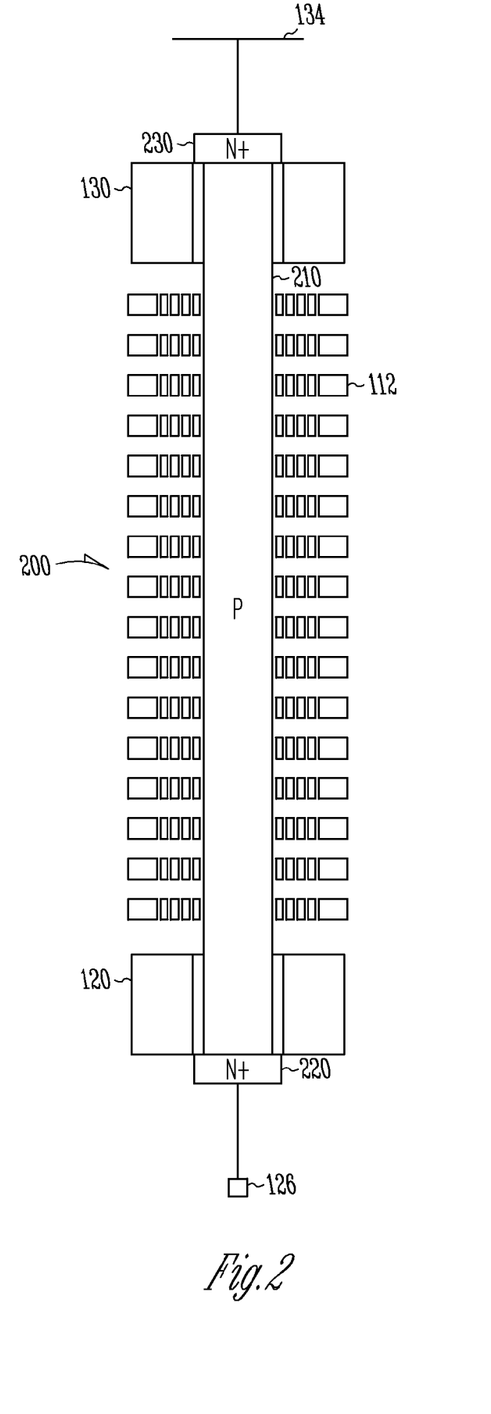
FIG. 2 shows a cross-sectional view of one embodiment of a semiconductor construction of a string of memory cells in accordance with FIG. 1.

FIG. 2 is a cross-sectional view of a semiconductor construction of the string 200 of FIG. 1. The memory cells 112, source select gate transistor 120 and the drain select gate transistor 130 at least partially surround (e.g., surround or partially surround) a semiconductor material 210. The semiconductor material 210, in one embodiment, can comprise a pillar of p-type polysilicon and can be used as a channel for the memory cells 112, the source select gate transistor 120 and the drain select gate transistor 130. The memory cells 112, the source select gate transistor 120 and the drain select gate transistor 130 can thus be associated with the pillar of semiconductor material 210. The pillar of semiconductor material 210 can extend between a source cap 220 (e.g., n+ type polysilicon) and a drain cap 230 (e.g., n+ type polysilicon). The source cap 220 can be in electrical contact with the pillar of semiconductor material 210 and can form a p-n junction with the semiconductor material 210. The drain cap 230 can be in electrical contact with the pillar of semiconductor material 210 and can form a p-n junction with the semiconductor material 210. The source cap 220 can be a source for the pillar of semiconductor material 210 and the drain cap 230 can be a drain for the pillar of semiconductor material 210. The source cap 220 can be coupled to the common source 126. The drain cap 230 can be coupled to the data line 134.

Figure 3:
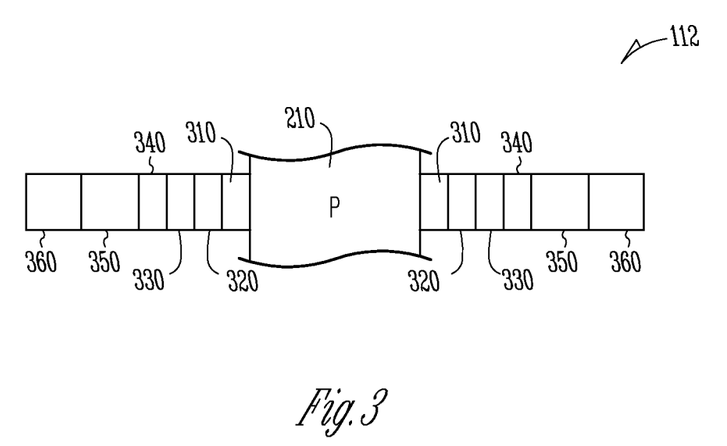
FIG. 3 shows a cross-sectional view of one embodiment of a semiconductor construction of a memory cell of the string shown in FIG. 2.

FIG. 3 is a cross-sectional view of a semiconductor construction of a memory cell 112 of the string 100 associated with the pillar 250 of FIG. 2. The memory cell 112 surrounds or partially surrounds the pillar of semiconductor material 210. The semiconductor material 210, in one embodiment, can comprise p-type polysilicon. The semiconductor material 210 may be surrounded or partially surrounded by a first dielectric 310 (e.g., silicon dioxide ($SiO_2$)). The first dielectric 310 may be surrounded or partially surrounded by a floating gate material 320 (e.g., polysilicon). The floating gate material 320 may be surrounded or partially surrounded by a second dielectric 330 (e.g., oxide-nitride-oxide or "ONO"). The third dielectric 340 may be surrounded or partially surrounded by a control gate 350 (e.g., polysilicon). The control gate 350 may be surrounded or partially surrounded by a metal material 360.

Figure 4:
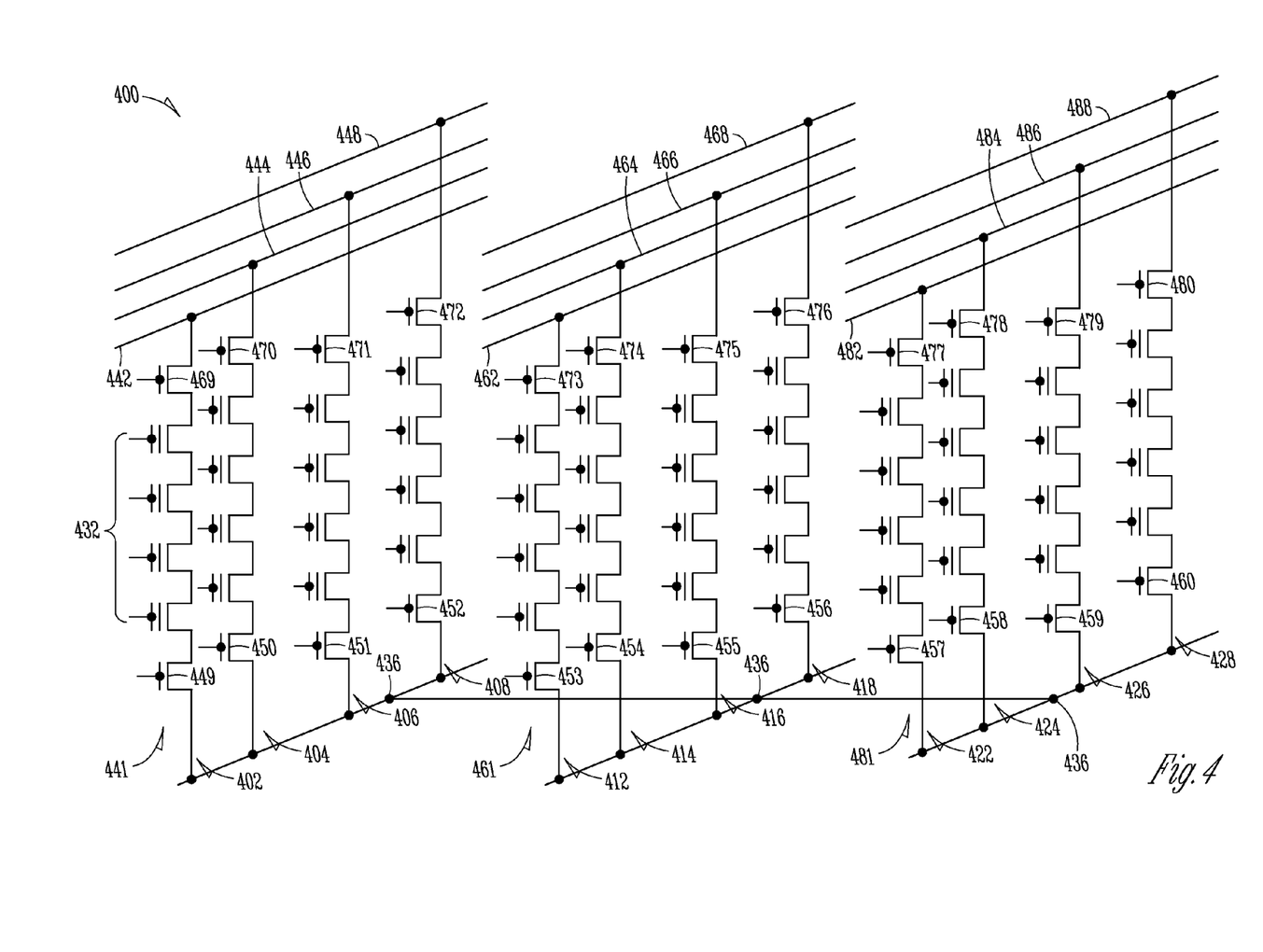
FIG. 4 shows a schematic diagram of a group of memory cells having a vertically stacked data line architecture.

FIG. 4 is a schematic diagram of one embodiment of a group 400 (e.g., block) of memory cells having a vertically stacked data line architecture. The embodiment illustrated in FIG. 4 illustrates a four layered data line architecture wherein the data lines extend horizontally substantially parallel with the plane of the substrate and each layer is formed vertically above an adjacent layer. The four layers are only for purposes of illustration. Other embodiments can have more or less than four data line layers, such as the two layered architecture that is described subsequently.

The illustrated group (e.g., a block or sub-block) of memory cells 400 includes twelve strings 402, 404, 406, 408, 412, 414, 416, 418, 422, 424, 426, 428 of memory cells 432. For purposes of illustration, each string 402, 404, 406, 408, 412, 414, 416, 418, 422, 424, 426, 428 is shown with four memory cells 432, a drain select gate transistor 469-480, and a source select gate transistor 449-460, respectively. Alternate embodiments can include strings with more or less than four memory cells 432.

The source select gate transistor 449-460 for each string can be coupled between one of the memory cells 432 at one end of the string and a single common source 436 for the block 400. In one or more embodiments, the control gates of the source select gate transistors (e.g., transistors 449, 450, 451, 452) of a sub-group of strings (e.g., sub-group 441) can be commonly coupled such that the source select gate transistors of that sub-group are commonly controlled. In certain embodiments, the control gates of the source select gate transistors of the entire group 400 can be commonly coupled such that the source select gate transistors of the group are commonly controlled. Meanwhile, the drain select gate transistor 469-480 for each string can be coupled at the other end of the string between one of the memory cells 432 and a data line as described below. In one or more embodiments, the control gates of respective drain select gate transistors (e.g., transistors 469, 473 and 477) from each sub-group of strings (e.g., sub-groups 441, 461 and 481) can be commonly coupled such that a respective drain select gate transistor (e.g., transistor 469) from each sub-group of the group 400 is commonly controlled with respective drain select gate transistors (e.g., transistors 473 and 477) from the other sub-groups of the group 400.

The composition of each of the subsequently described strings of memory cells 402, 404, 406, 408, 412, 414, 416, 418, 422, 424, 426, 428 can be substantially similar to the string of memory cells 402 previously described. Also, as shown in FIG. 4, control gates of the first memory cell 432 in each of one or more of strings 402, 404, 406, 408, 412, 414, 416, 418, 422, 424, 426, 428 may be commonly coupled and formed in a first tier above a substrate (not shown). Such an arrangement could be continued throughout the group 400, such as where control gates of second memory cells 432 in each of the one or more of strings 402, 404, 406, 408, 412, 414, 416, 418, 422, 424, 426, 428 may be commonly coupled and formed in a second tier above the substrate (not shown), control gates of third memory cells in each of the one or more of strings 402, 404, 406, 408, 412, 414, 416, 418, 422, 424, 426, 428 may be commonly coupled and formed in a third tier above the substrate (not shown), and so forth. As subsequently described, the particular data line to which each string of memory cells shown in group 400 is connected is different.

The strings of memory cells 402, 404, 406, 408 comprise a first sub-group 441 of strings in the group 400 wherein the control gate of each memory cell 432 of each string 402, 404, 406, 408 is coupled through a respective access line (e.g., row) to a respective one of the memory cells 432 in the other strings 402, 404, 406, 408 of the first sub-group 441. The strings of memory cells 402, 404, 406, 408 are coupled to four separate data lines 442, 444, 446, 448 in a first plurality of vertically stacked data lines that are located over the strings 402, 404, 406, 408. The drain select gate transistor 469 of the string 402 is coupled to the data line 442. The drain select gate transistor 470 of the string 404 is coupled to the data line 444. The drain select gate transistor 471 of the string 406 is coupled to the data line 446. The drain select gate transistor 472 of the string 408 is coupled to the data line 448.

The strings of memory cells 412, 414, 416, 418 comprise a second sub-group 461 of strings in the group 400 wherein the control gate of each memory cell 432 of each string 412, 414, 416, 418 is coupled through a respective access line (e.g., row) to a respective one of the memory cells 432 in the other strings 412, 414, 416, 418 of the second sub-group 461. The strings of memory cells 412, 414, 416, 418 are coupled to four separate data lines 462, 464, 466, 468 in a second plurality of vertically stacked data lines. The second plurality of vertically stacked data lines are located over the strings 412, 414, 416, 418 and are adjacent to the first plurality of data lines (e.g., data lines 442, 444, 446, 448) in a direction orthogonal to a direction in which the first plurality of stacked data lines extend. The drain select gate transistor 473 of the string 412 is coupled to the data line 462 and, in one or more embodiments, has a control gate that is commonly coupled with the control gate of drain select gate transistor 469. The drain select gate transistor 474 of the string 414 is coupled to the data line 464 and, in one or more embodiments, has a control gate that is commonly coupled with the control gate of drain select gate transistor 470. The drain select gate transistor 475 of the string 416 is coupled to the data line 466 and, in one or more embodiments, has a control gate that is commonly coupled with the control gate of drain select gate transistor 471. The drain select gate transistor 476 of the string 418 is coupled to the data line 468 and, in one or more embodiments, has a control gate that is commonly coupled with the control gate of drain select gate transistor 472.

The strings of memory cells 422, 424, 426, 428 comprise a third sub-group 481 of strings in the group 400 wherein the control gate of each memory cell 432 of each string 422, 424, 426, 428 is coupled through a respective access line (e.g., row) to a respective one of the memory cells 432 in the other strings 422, 424, 426, 428 of the third sub-group 481. The strings of memory cells 422, 424, 426, 428 are coupled to four separate data lines 482, 484, 486, 488 in a third plurality of vertically stacked data lines. The third plurality of vertically stacked data lines are adjacent to the second plurality of data lines (e.g., data lines 462, 464, 466, 468) in a direction orthogonal to a direction in which the second plurality of stacked data lines extend. The drain select gate transistor 477 of the string 422 is coupled to the data line 482 and, in one or more embodiments, has a control gate that is commonly coupled with the control gates of drain select gate transistors 469 and 473. The drain select gate transistor 478 of the string 424 is coupled to the data line 484 and, in one or more embodiments, has a control gate that is commonly coupled with the control gates of drain select gate transistors 470 and 474. The drain select gate transistor 479 of the string 426 is coupled to the data line 486 and, in one or more embodiments, has a control gate that is commonly coupled with the control gates of drain select gate transistors 471 and 475. The drain select gate transistor 480 of the string 428 is coupled to the data line 488 and, in one or more embodiments, has a control gate that is commonly coupled with the control gates of drain select gate transistors 472 and 476.

Adjacent strings 402, 404, 406, 408, 412, 414, 416, 418, 422, 424, 426, 428 in the illustrated group 400 are coupled to different data lines 442, 444, 446, 448, 462, 464, 466, 468, 482, 484, 486, 488. For example, the strings 402 and 404 are adjacent in a direction in which the first plurality of data lines extend and are coupled to different data lines 442 and 444 in the first plurality of vertically stacked data lines. Meanwhile, the strings 402 and 412 are adjacent in a direction orthogonal to a direction in which the first plurality of data lines extend and are coupled to different data lines 442 and 462.

The data lines 442, 462, 482 can be formed from a first layer of conductive material formed in a first tier above the strings 402, 404, 406, 408, 412, 414, 416, 418, 422, 424, 426, 428. The data lines 444, 464, 484 can be formed from a second layer of conductive material formed in a second tier above the data lines 442, 462, 482. The data lines 446, 466, 486 can be formed from a third layer of conductive material formed in a third tier above the data lines 444, 464, 484. The data lines 448, 468, 488 can be formed from a fourth layer of conductive material formed in a fourth tier above the data lines 446, 466, 486.

During a first memory operation (e.g., sense), data lines are selected in alternate layers (e.g., every other layer). Unselected data lines in alternate layers (e.g., remaining layers not selected) are coupled to a first shield potential (e.g., ground) during at least a portion of the first memory operation. The unselected data lines can act as a shield for the selected data lines during at least a portion of the first memory operation (e.g., sense). Capacitive coupling between adjacent data lines can thus be reduced by the unselected data lines. Reduced coupling between adjacent data lines can result in improved operating speed during memory operations. During at least a portion of a second memory operation (e.g., program), the unselected data lines, in alternate layers, can be coupled to a second shield potential (e.g., an inhibit potential, such as the supply voltage $V_{CC}$) to shield the unselected memory cells coupled to the unselected data lines from programming.

Figure 5:
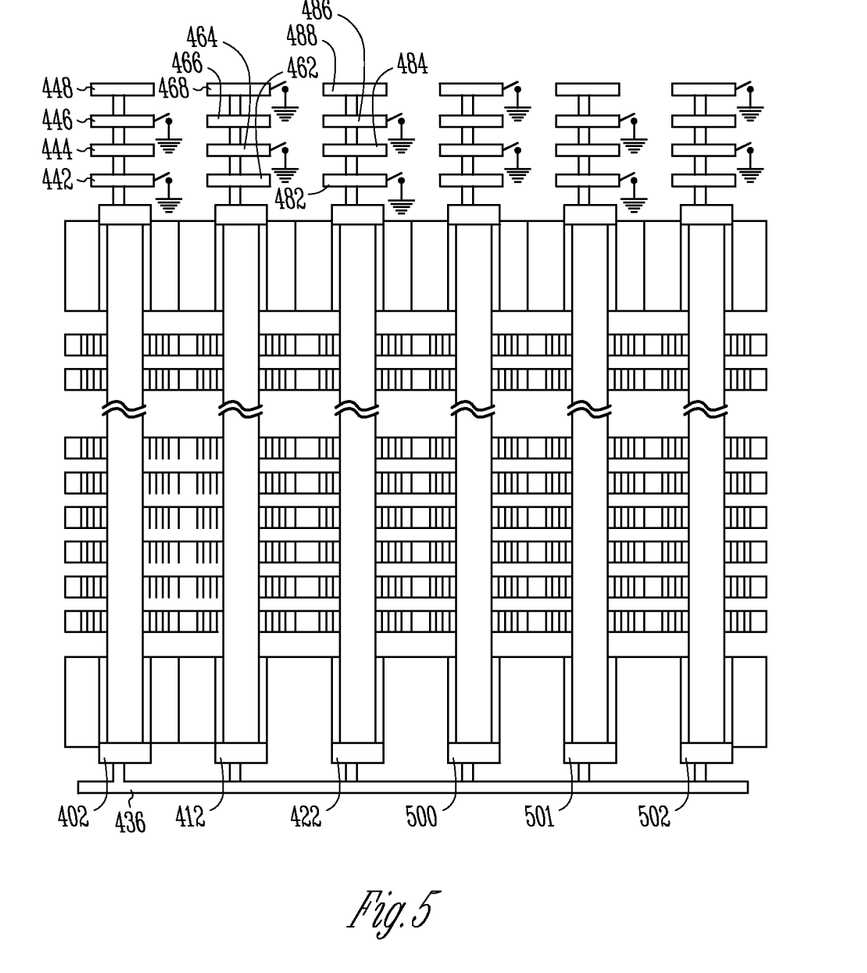
FIG. 5 shows a schematic diagram of one embodiment of a memory operation using a shielded vertically stacked data line architecture in accordance with FIG. 4.

FIG. 5 illustrates a schematic diagram of one embodiment of the first memory operation (e.g., sense) using a shielded, vertically stacked data line architecture illustrated in FIG. 4. FIG. 5 incorporates the semiconductor construction illustrated in FIG. 2 with the vertically stacked data line architecture of FIG. 4. Although each of the data lines in a respective stack of data lines are shown in, for example, FIG. 5 as being vertically aligned with each of the other data lines in the respective stack, one or more of the data lines in a given stack of data lines could alternatively be offset from one or more of the other data lines of such a stack in other embodiments.

The first three strings 402, 412, 422 of FIG. 5 are discussed subsequently as they correspond to the sub-groups 441, 461, 481, respectively, of FIG. 4. The remaining strings 500, 501, 502 have a substantially similar construction (e.g., groups) and operate in a substantially similar fashion.

Referring to both FIGS. 4 and 5, the strings 402, 412, 422 of FIG. 5 represent the sub-groups 441, 461, 481 of FIG. 4, respectively. The strings 402, 412, 422 are shown coupled to a source 436. The vertically stacked data lines 442, 444, 446, 448, 462, 464, 466, 468, 482, 484, 486, 488 are shown formed above the strings 402, 412, 422. The data lines 442, 444, 446, 448, 462, 464, 466, 468, 482, 484, 486, 488, as illustrated in FIG. 4, extend into the page along the z-axis.

The schematic diagram of FIG. 5 illustrates that, during at least a portion of the first memory operation (e.g., sense), alternating unselected data lines 442, 446, 464, 468, 482, 486 are coupled to the first shield potential (e.g., ground) in order to provide shielding for the alternating selected data lines 444, 448, 462, 466, 484, 488. The alternating selected data lines 444, 448, 462, 466, 484, 488 are used during the memory operation to determine a state of one or more selected memory cells that are coupled to a respective selected data line. For example, in the embodiment shown in FIG. 5, alternating data lines 442 and 446, in a stack that also includes selected data lines 444 and 448, are coupled to the first shield potential. In such an embodiment, data line 442 may be coupled to an unselected string 402, data lines 444 and 448 may be coupled to selected strings (not shown), and data line 446 may be coupled to an unselected string (not shown). As also shown in FIG. 5, alternating data lines in a respective tier, such as the data lines 442 and 482 in the tier that also includes selected data line 462, are coupled to the first shield potential. In such an embodiment, data line 442 may be coupled to an unselected string 402, data line 462 may be coupled to a selected string 412, and data line 482 may be coupled to an unselected string 422.

Figure 6:
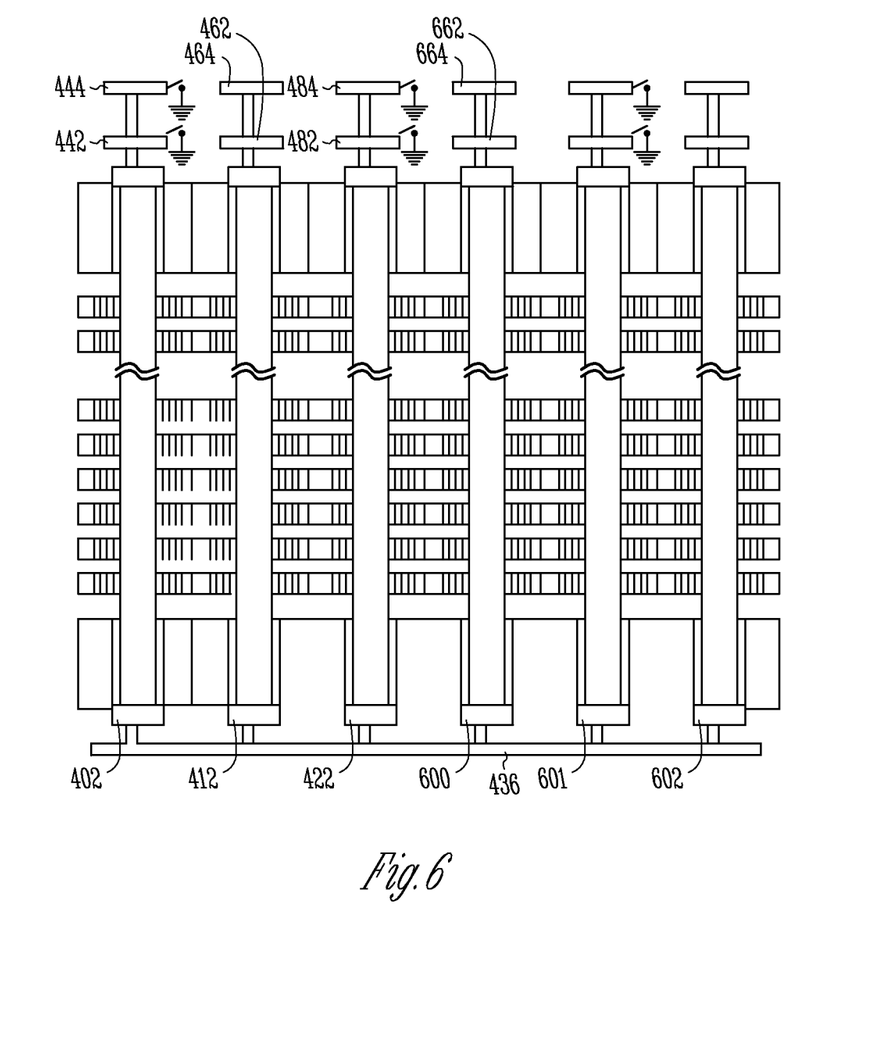
FIG. 6 shows a schematic diagram of another embodiment of a memory operation using a shielded vertically stacked data line architecture in accordance with FIG. 4.

FIG. 6 illustrates a schematic diagram of another embodiment of the first memory operation (e.g., sense) using a shielded, vertically stacked data line architecture in accordance with FIG. 4. FIG. 6 incorporates the semiconductor construction illustrated in FIG. 2 with a portion of the vertically stacked data line architecture of FIG. 4. The embodiment of FIG. 6 uses a two layer data line architecture.

The first three strings 402, 412, 422 of FIG. 6 are discussed subsequently as they correspond to the sub-groups 441, 461, 481, respectively, of FIG. 4. The remaining strings 600, 601, 602 have a substantially similar construction and operate in a substantially similar fashion.

Referring to both FIGS. 4 and 6, the strings 402 and 412 of FIG. 6 represent adjacent strings of the sub-groups 441 and 461 of FIG. 4, respectively. The strings 402, 412, 422 are shown coupled to a source 436. The vertically stacked data lines 442, 444, 462, 464, 482, 484 are shown formed above the strings 402, 412, 422. The vertically stacked data lines 442, 444, 462, 464, 482, 484, as illustrated in FIG. 4, extend into the page along the z-axis.

The schematic diagram of FIG. 6 illustrates that, during at least a portion of the first memory operation (e.g., sense), unselected data lines 442, 444, 482, 484 are coupled to the first shield potential (e.g., ground) and selected data lines 462, 464, 662, 664 are used during the first memory operation to determine a state of one or more selected memory cells that are coupled to a respective selected data line. In the embodiment shown in FIG. 6 alternating stacks of data lines, such as the stack of data lines including data lines 442 and 444, and the stack of data lines including data lines 482 and 484, are shown as being coupled to the first shield potential. For example, data lines 442 and 482 may be coupled to unselected strings 402 and 422 (while data line 462 may be coupled to a selected string 412). Although not explicitly shown in FIG. 6, data lines 444 and 484 may be coupled to other unselected strings (not shown) and data line 464 may be coupled to another selected string (not shown).

Figure 7:
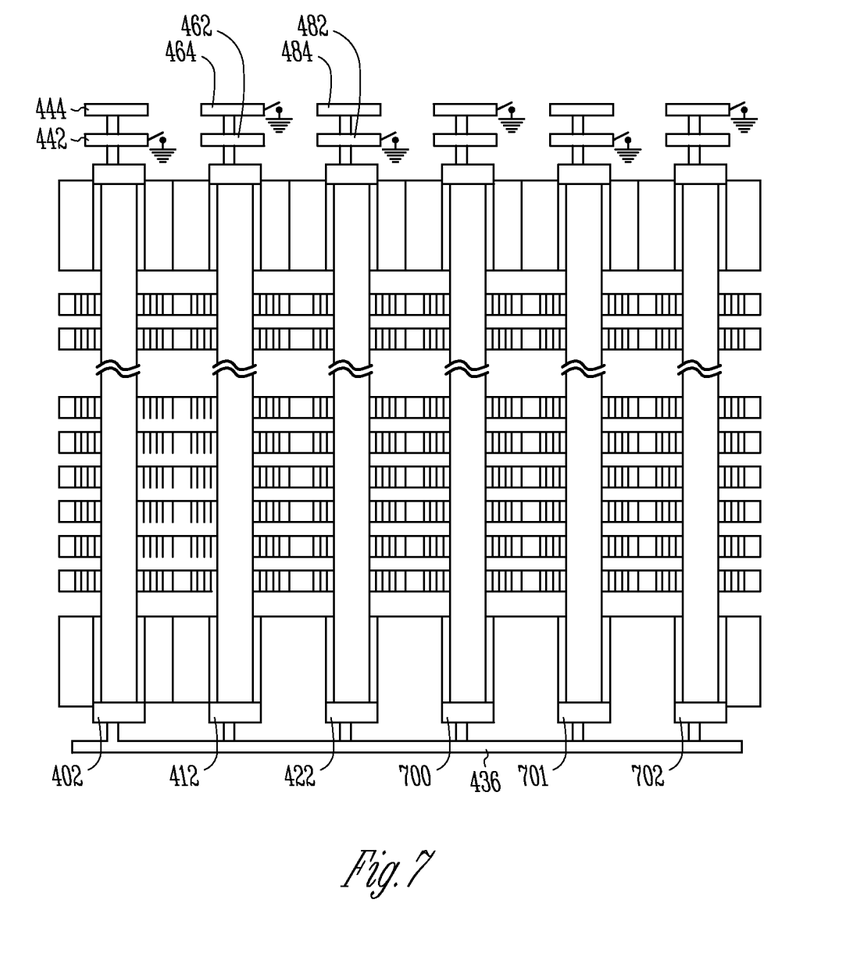
FIG. 7 shows a schematic diagram of another embodiment of a memory operation using a shielded vertically stacked data line architecture in accordance with FIG. 4.

FIG. 7 illustrates a schematic diagram of another embodiment of the first memory operation (e.g., sense) using a shielded, vertically stacked data line architecture in accordance with FIG. 4. FIG. 7 incorporates the semiconductor construction illustrated in FIG. 2 with a portion of the vertically stacked data line architecture of FIG. 4. The embodiment of FIG. 7 uses a two layer data line architecture.

The first three strings 402, 412 and 422 of FIG. 7 are discussed subsequently as they correspond to the sub-groups 441, 461, 481, respectively, of FIG. 4. The remaining strings 700, 701, 702 have a substantially similar construction and operate in a substantially similar fashion.

Referring to both FIGS. 4 and 7, the strings 402 and 412 of FIG. 7 represent two adjacent strings of the sub-groups 441 and 461 of FIG. 4, respectively. The strings 402, 412 and 422 are shown coupled to a source 436. The vertically stacked data lines 442, 444, 462, 464, 482, 484 are shown formed above the strings 402, 412 and 422. The data lines 442, 444, 462, 464, 482, 484, as illustrated in FIG. 4, extend into the page along the z-axis.

The schematic diagram of FIG. 7 illustrates that, during at least a portion of the first memory operation (e.g., sense), alternating unselected data lines 442, 464, 482 are coupled to the first shield potential (e.g., ground) in order to provide shielding for the alternating selected data lines 444, 462, 484. The alternating selected data lines 444, 462, 484, are used during the memory operation to determine a state of one or more selected memory cells that are coupled to a respective selected data line. In the embodiment shown in FIG. 7, alternating data lines in a respective tier (e.g, the data lines 442 and 482 in the tier that also includes selected data line 462) are coupled to the first shield potential. For example, data lines 442 and 482 may be coupled to unselected strings 402 and 422 (while data line 462 may be coupled to a selected string 412). Meanwhile, although not explicitly shown in FIG. 6, data line 464 (e.g., in a second tier) may be coupled to another unselected string (not shown) while data lines 444 and 484 (also in the second tier) may be coupled to other selected strings (not shown).

Figure 8:
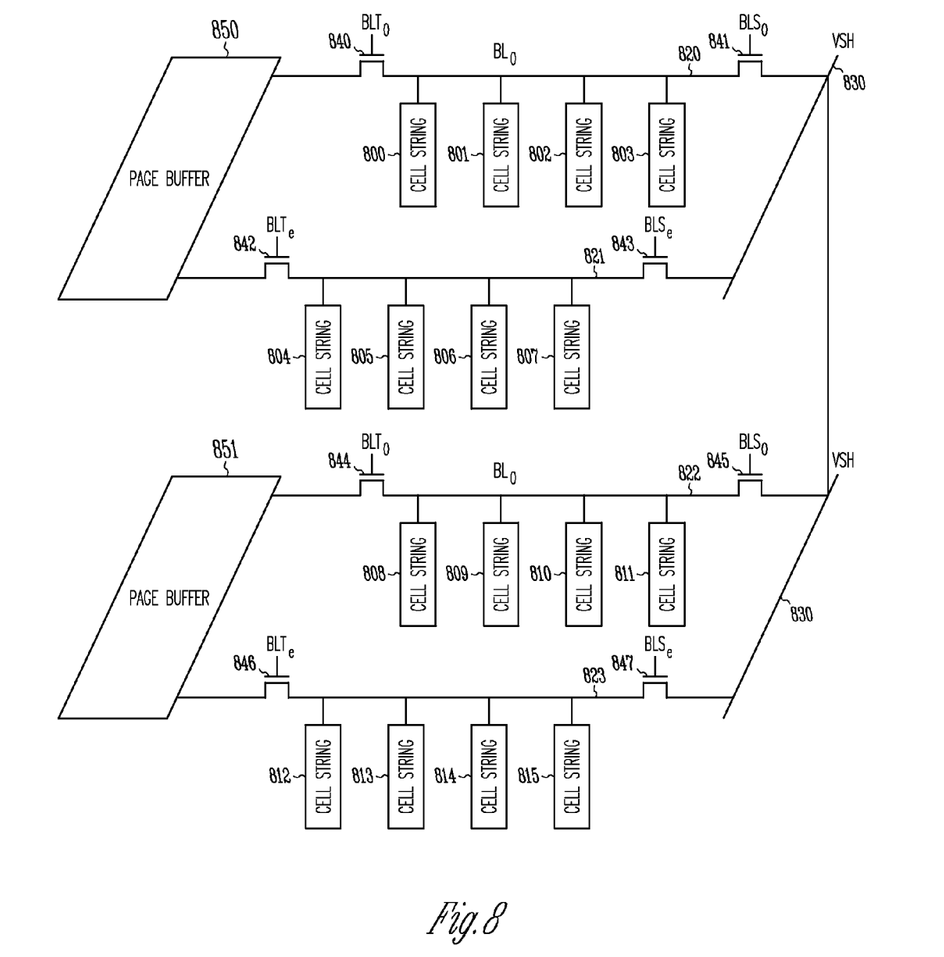
FIG. 8 illustrates a schematic diagram of one embodiment of a circuit configured to couple alternating data lines to different potentials.

Coupling alternating data lines to one of the shield potentials (e.g., ground, $V_{CC}$) during at least a portion of the first or a second memory operation (e.g., sense, program) can be accomplished using various circuits and methods. FIG. 8 illustrates a schematic diagram of a circuit configured to couple alternating data lines to a different potential (e.g., ground, $V_{CC}$), depending on the memory operation (e.g., sense, program).

FIG. 8 illustrates a plurality of memory cell strings 800-815 that can be formed vertically with respect to a substrate, such as where each of the strings may be similar to string 200 of FIG. 2. The memory cell strings 800-815 can be coupled to either an odd data line $BL_o$ 820, 822 or an even data line $BL_e$ 821, 823. The odd and even data lines 820-823 can be formed adjacent to each other (e.g., either vertically or horizontally) in an alternate fashion, such as the data lines illustrated in FIG. 4.

The memory cell strings 800-815 can be coupled to page buffers 850, 851 that can be configured to temporarily store data read from one or more selected memory cells from one or more selected data lines 820-823. The data lines 820-823 are coupled to the page buffers 850, 851 through data line transfer transistors 840, 842, 844, 846. For example, when a data line has been selected for the first memory operation (e.g., sense), the selected data line's respective transfer transistor 840, 842, 844, 846 can be enabled to allow current on the selected data line 820-823 to flow to the respective page buffer 850, 851.

The data lines 820-823 can be coupled to a shield voltage line VSH 830 through data line shield transistors 841, 843, 845, 847. The shield voltage line VSH 830 can be a common node that can be switched to the different potentials used during at least a portion of the various memory operations (e.g., sense, program). For example, as described previously, when a data line is unselected during the first memory operation (e.g., sense), it can be coupled to the shield voltage line 830 that is at a first potential (e.g., ground) in order to provide shielding for the selected data lines. During at least a portion of this operation, the VSH line 830 can be at the first potential (e.g., ground) and the particular data line shield transistor 841, 843, 845, 847 for the unselected data lines can be enabled. When a data line is selected, the data line shield transistors 841, 843, 845, 847 isolate the data line from the VSH line 830.

In another example, when a data line is unselected during the second memory operation (e.g., program), it can be coupled to the second potential (e.g., $V_{CC}$) in order to provide the inhibiting for the unselected data lines. During at least a portion of this operation, the VSH line 830 can be at the second potential (e.g., $V_{CC}$) and the particular data line shield transistor 841, 843, 845, 847 for the unselected data lines can be enabled.

By particular example, as shown in FIG. 8, a data line 820 coupled to a first memory cell string 800 and a data line 821 coupled to a second memory cell string 804 are coupled to a common page buffer 850 through first and second data line transfer transistors 840 and 842, respectively. The first and second data line transfer transistors 840 and 842 are configured to alternately couple the common page buffer 850 to a respective one of the first and second data lines 820 and 821. The first and second data lines 820 and 821 are also coupled to the common node 830 through first and second data line shield transistors 841 and 843, respectively. The first and second data line shield transistors 841 and 843 are configured to alternately couple the common node 830 to a respective one of the data lines 820, 821, such as to alternately provide a shield potential to the data lines 820, 821.

Figure 9:
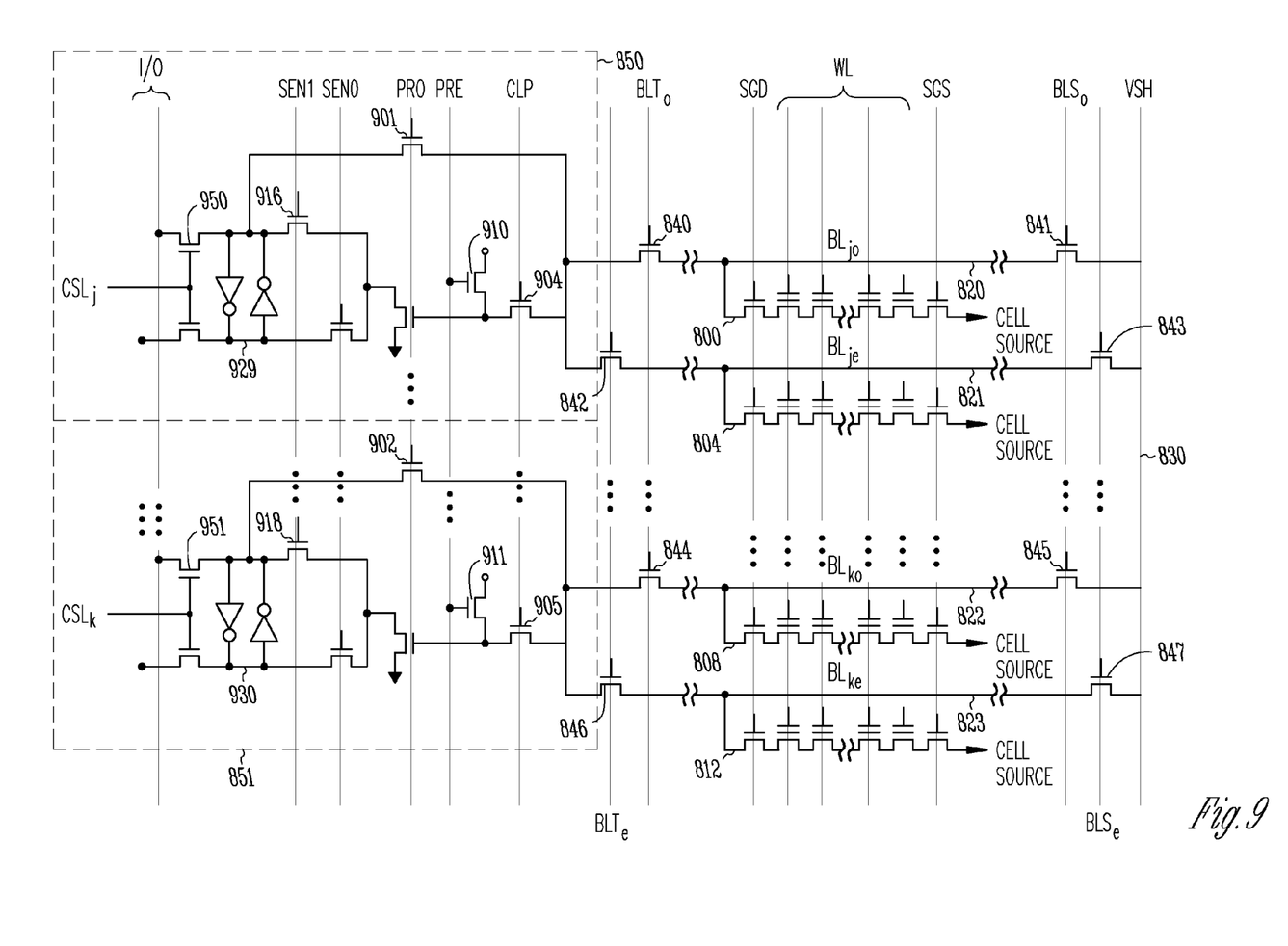
FIG. 9 shows a schematic diagram of one embodiment of the circuit of FIG. 8 in accordance with the timing diagrams of FIGS. 10 and 11.
Figure 10:
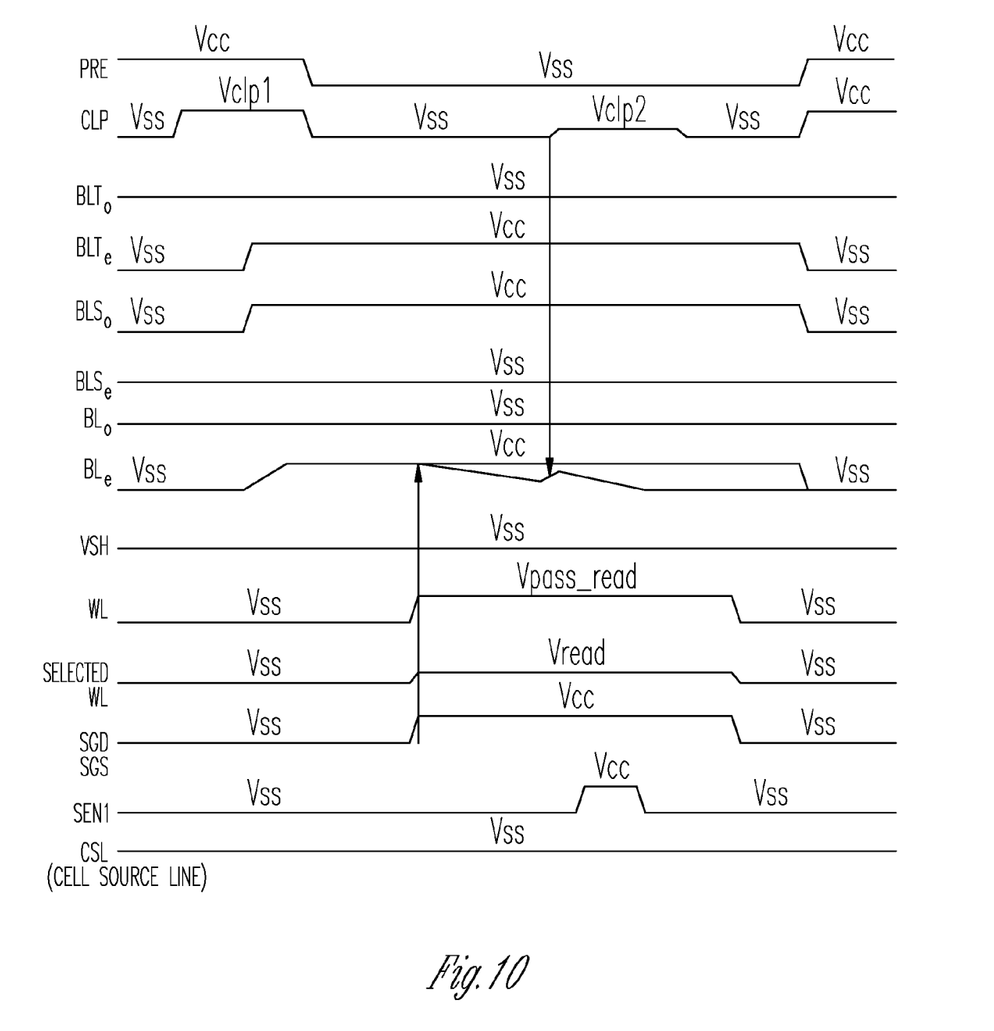
FIG. 10 shows a timing diagram of one embodiment of a sense operation in accordance with the embodiment of FIG. 9.

FIG. 9 shows a schematic diagram of one embodiment of the circuit of FIG. 8 in accordance with the timing diagrams of FIGS. 10 (e.g., sense operation timing) and 11 (e.g., program operation timing). For purposes of clarity, the circuit diagram of FIG. 9 shows only one string of memory cells coupled to each data line. The circuit of FIG. 9 also shows the page buffers 850, 851 in greater detail in order to show their different operations during various memory operations (e.g., sense, program) in conjunction with the respective timing diagrams of FIGS. 10 and 11.

Referring to both the circuit of FIG. 9 and the timing diagram of FIG. 10, a sense operation can comprise initially pre-charging the data lines 820-823 by enabling the pre-charge transistors 910, 911, that are pulled up to a voltage (e.g., $V_{CC}$) with the PRE signal. During the time that CLP is at a positive voltage (e.g., $V_{CC}$), the transistors 904, 905 are enabled and the voltage (e.g., $V_{CC}$) can then bias the data lines having enabled transfer transistors 840, 842, 844, 846. In the illustrated embodiment of FIG. 10, the $BLT_o$ signal is at $V_{SS}$ so that the odd transfer transistors 840, 844 are disabled and the odd data lines 820, 822 are unselected. The $BLT_e$ signal is at a positive voltage (e.g., $V_{CC}$) during this time so the even transfer transistors 842, 846 are enabled and the pre-charge voltage can be used to bias the even data lines 821, 823. Also during this time, the odd data line shield transistors 841, 845 are enabled by the $BLS_O$ voltage (e.g., $V_{CC}$) so that the unselected data lines 820, 822 can be coupled to the VSH line 830 that can be at $V_{SS}$. The $BLS_e$ voltage can be at $V_{SS}$ so that the even data line shield transistors 843, 847 are disabled and the even data lines are not coupled to the VSH line 830.

For the sense operation to occur, the unselected access lines WL can be biased at a pass voltage $V_{PASS\_READ}$ while the selected access line (not shown) can be biased at a read voltage $V_{READ}$. While these pass and read voltages bias the access lines, the select gate drain and source transistors for the selected memory cell strings can be enabled by both SGD and SGS being at a positive voltage (e.g., $V_{CC}$). When the SEN1 signal is at a positive voltage (e.g., $V_{CC}$), sense transistors 916, 918 are enabled so that the data read from the selected memory cell(s) can be latched into the latch circuits 929, 930 of the page buffers 850, 851. The data in the latch circuits 929, 930 can then be output to the I/O lines when the output enable transistors 950, 951 are enabled.

Figure 11:
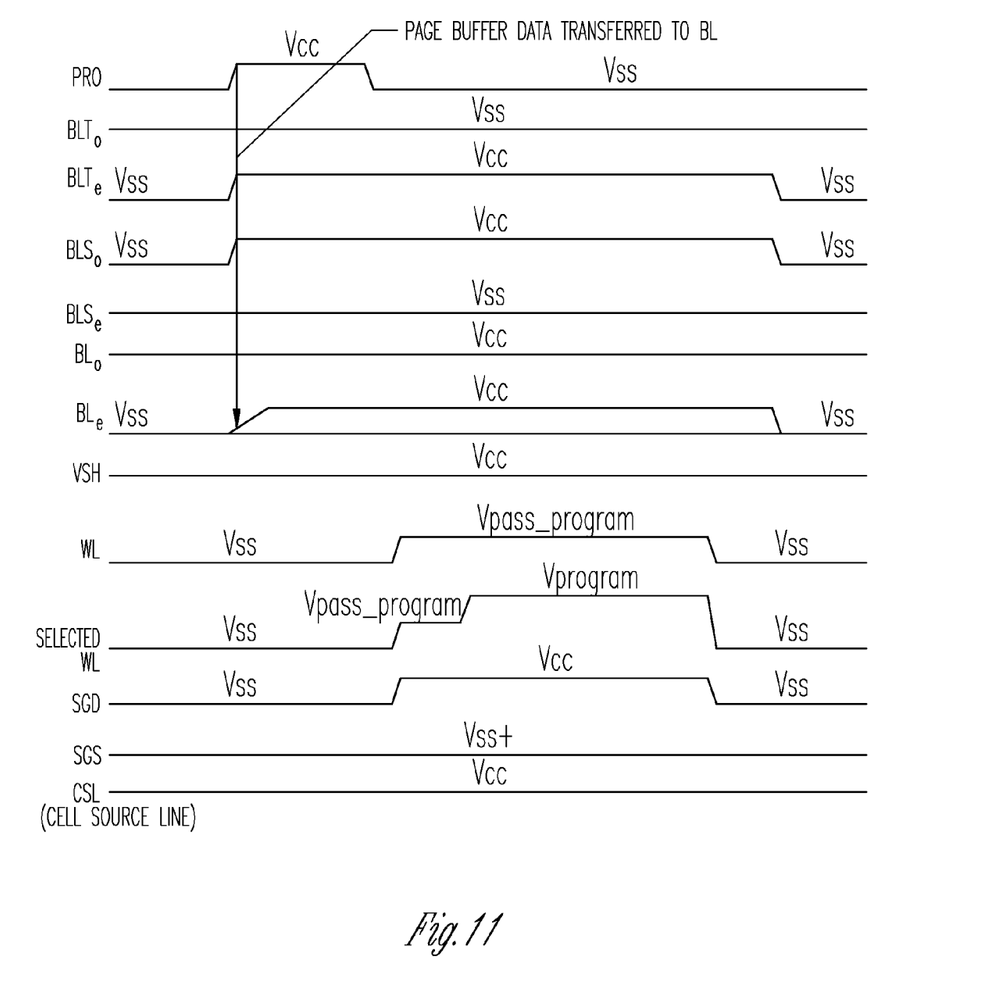
FIG. 11 shows a timing diagram of one embodiment of a program operation in accordance with the embodiment of FIG. 9.

Referring to the circuit of FIG. 9 and the timing diagram of FIG. 11, a program operation can comprise the programming transistors 901, 902 being enabled by a positive voltage (e.g., $V_{CC}$). Enabling the programming transistors 901, 902 enables the page buffer data that are stored in the latch circuits 929, 930, to be transferred to the data lines 820-823. However, since the odd transfer transistors 840, 844 can be turned off by $BLT_o$ being at $V_{SS}$ and the even transfer transistors 842, 846 can be turned on by $BLT_e$ being at a positive voltage (e.g., $V_{CC}$), the page buffer data can be applied only to the even data lines 821, 823. The odd data lines 820, 822 can thus be unselected and the even data lines 821, 823 can be selected.

During this time, the odd shield transistors 841, 845 can be turned on by a positive $BLS_o$ voltage (e.g., $V_{CC}$) and the even shield transistors 843, 847 can be turned off (e.g., $BLS_e$ at $V_{SS}$). Since the VSH line 830 can be at a positive voltage (e.g., $V_{CC}$), this voltage can be allowed to bias the unselected, odd data lines 820, 822.

The unselected access lines WL can be biased at a pass voltage $V_{PASS\_PROGRAM}$ while the selected access lines can be biased at a program voltage $V_{PROGRAM}$. Also during this time, the select gate drain transistors can be turned on by SGD being at a positive voltage (e.g., $V_{CC}$) and the select gate source transistors can be turned off by SGS being at $V_{SS}$. The source can also be at a positive voltage (e.g., $V_{CC}$) during the programming operation.

Figure 12:
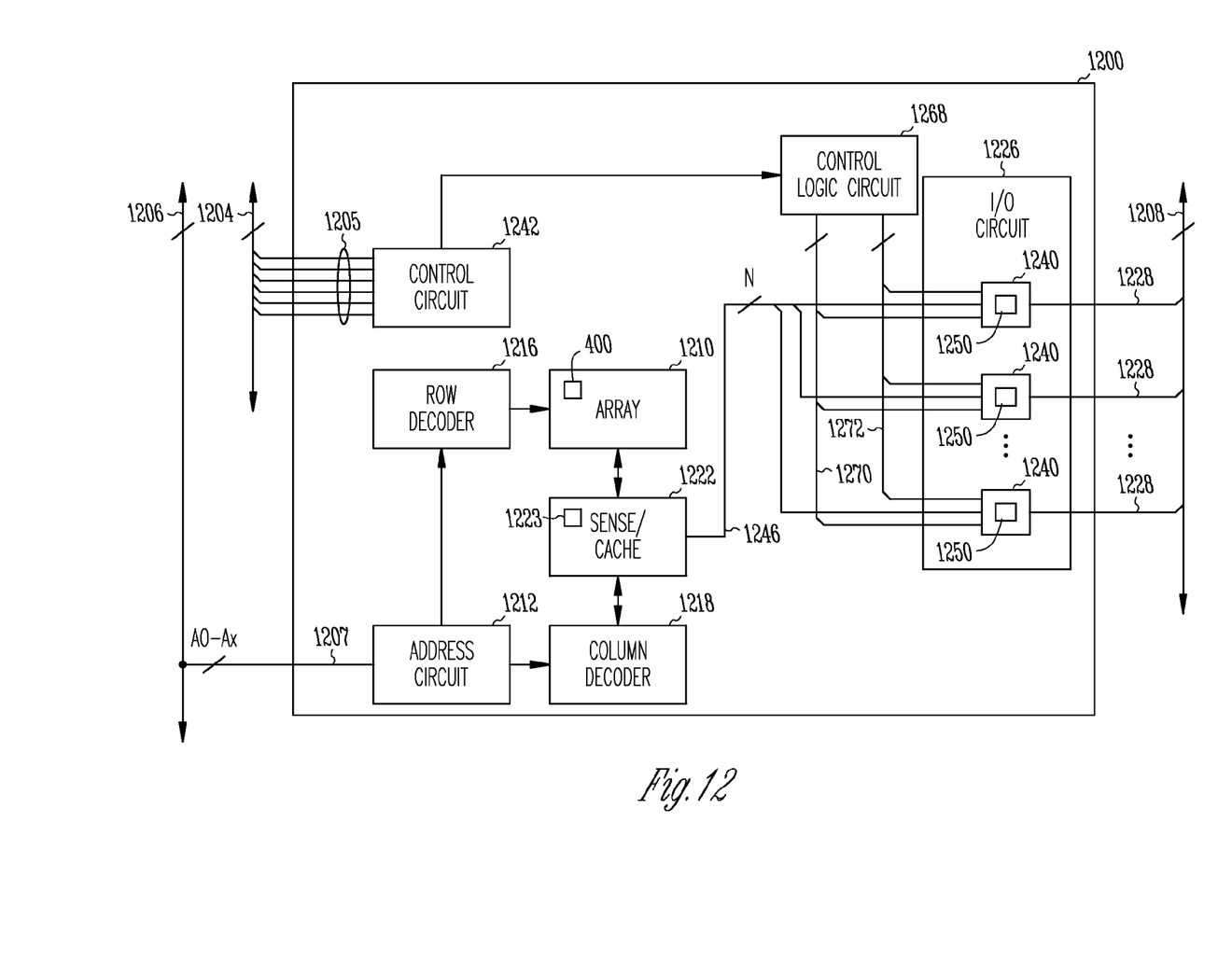
FIG. 12 shows a block diagram of a system.

FIG. 12 is a block diagram of an apparatus in the form of a memory device 1200 according to various embodiments of the invention. The memory device 1200 is coupled to a control bus 1204 to receive multiple control signals over control signal lines 1205. The memory device 1200 is also coupled to an address bus 1206 to receive address signals A0-Ax on address signal lines 1207 and to a data bus 1208 to transmit and receive data signals. Although depicted as being received on separate physical buses, the data signals could also be multiplexed and received on the same physical bus. The memory device 1200 may be coupled to a processor (not shown) in a system.

The memory device 1200 includes one or more arrays 1210 of memory cells that can be arranged in rows and in columns. The memory cells of the array 1210 can be non-volatile memory cells (e.g., charge storage devices, such as floating gate transistors or charge trap transistors) according to various embodiments of the invention. The memory device 1200 can be a NAND memory device. The array 1210 can include multiple banks and blocks of memory cells residing on a single die or on multiple dice as part of the memory device 1200. The memory cells in the array 1210 can be SLC or MLC memory cells, or combinations thereof. The array 1210 includes one or more of the group 400 of memory cells 432 shown in FIG. 4 according to various embodiments of the invention.

An address circuit 1212 can latch the address signals A0-Ax received on the address signal lines 1207. The address signals A0-Ax can be decoded by a row decoder 1216 and a column decoder 1218 to access data stored in the array 1210. The memory device 1200 can read data in the array 1210 by sensing voltage or current changes in memory cells in the array 1210 using page buffers in a sense/cache circuit 1222. The sense/cache circuit 1222 includes a page buffer 1223 coupled to each of the data lines in the block 400 to sense and latch a data state of the respective data lines 442, 444, 446, 448, 462, 464, 466, 468, 482, 484, 486 and 488 shown in FIG. 4.

A data input and output (I/O) circuit 1226 implements bi-directional data communication over external (e.g., data I/O) nodes 1228 coupled to the data bus 1208. The I/O circuit 1226 includes N driver and receiver circuits 1240 according to various embodiments of the invention. The memory device 1200 includes a control circuit 1242 that is configured to support operations of the memory device 1200, such as writing data to and/or erasing data from the array 1210. The control circuit 1242 can be configured to implement a state machine and be located on a same or different die than that which includes the array 1210 and/or any or all of the other components of the memory device 1200. The control circuit 1242 can comprise hardware, firmware, software, or combinations of any or all of the foregoing. Data can be transferred between the sense/cache circuit 1222 and the I/O circuit 1226 over N signal lines 1246. As used herein, a controller can refer to, for example, one or more of the following components: control circuit 1242, control logic circuit 1268, row decoder 1216, address circuit 1212, column decoder 1218, sense/cache circuit 455, and/or I/O circuit 1226. In different embodiments, a controller (or components thereof) can be located on a same semiconductor die as the array 1210, or on a different semiconductor die than the array 1210. The above-described embodiments, among others, can be implemented using the controller.

Each driver and receiver circuit 1240 includes a driver circuit 1250. Control signals can be provided to the driver circuits 1250 (e.g., through control logic circuit 1268 that is coupled to the control circuit 1242). The control logic circuit 1268 can provide the control signals over lines 1270 and 1272 to the driver circuits 1250.

Example structures and methods of blocks of vertical strings of memory cells (e.g., with respect to a substrate) have been described as specific embodiments, but it will be evident that various modifications and changes may be made. Accordingly, the specification and drawings are to be regarded in an illustrative rather than a restrictive sense.

CONCLUSION

One or more embodiments provide vertically stacked data lines that can be alternately coupled to a shield potential during at least a portion of a first memory operation (e.g., sense) and/or a second memory operation (e.g., program). By switching unselected data lines, in alternate layers, to a node that is at a first potential (e.g., reference potential, ground) the unselected data lines can act as a shield for the selected data lines, in alternate layers, during at least a portion of the first memory operation (e.g., sense). This can reduce capacitive coupling between adjacent data lines. During at least a portion of the second memory operation (e.g., program), the unselected data lines, in alternate layers, can be switched to the node that is at a second potential (e.g., $V_{CC}$) to inhibit programming of the unselected memory cells coupled to the unselected data lines.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method comprising:
    applying a pass voltage to unselected access lines of a plurality of access lines;
    applying an operational voltage to selected access lines of the plurality of access lines to enable particular memory cells;
    enabling first shield transistors that couple first alternating data lines of a plurality of vertically stacked data lines to a shield voltage line; and
    disabling second shield transistors that couple second alternating data lines of the plurality of vertically stacked data lines to the shield voltage line,
    wherein strings of memory cells comprising the enabled memory cells are operably coupled to the second alternating data lines and strings of memory cells that do not comprise the enabled memory cells are operably coupled to the first alternating data lines.

2. The method of claim 1, wherein the operational voltage is a sense voltage.

3. The method of claim 2, wherein the shield voltage line is at ground.

4. The method of claim 3, further comprising enabling select gate drain and select gate source transistors that are coupled to strings of memory cells comprising the enabled memory cells.

5. The method of claim 4, further comprising enabling sense transistors to latch data from selected memory cells into page buffers.

6. The method of claim 1, further comprising disabling select gate drain and select gate source transistors that are coupled to strings of memory cells that do not comprise the enabled memory cells.

7. The method of claim 1, wherein the operational voltage is a program voltage.

8. The method of claim 1, further comprising applying a ground voltage to the shield voltage line when the operational voltage is a sense voltage.

9. The method of claim 1, further comprising applying a positive voltage to the shield voltage line when the operational voltage is a program voltage.

10. A method comprising:
    applying a read voltage to selected access lines of a plurality of access lines to enable particular memory cells;
    applying a read pass voltage to unselected access lines of the plurality of access lines;
    applying a pre-charge voltage to first alternating data lines of a plurality of vertically stacked data lines;
    applying a shield voltage to second alternating data lines of the plurality of vertically stacked data lines;
    applying an enable voltage to select gate drain transistors that couple first memory cell strings, comprising the enabled memory cells, to the first alternating data lines; and
    applying a disable voltage to select gate drain transistors that couple second memory cell strings that do not comprise the enabled memory cells.

11. The method of claim 10, wherein the first alternating data lines are even data lines that are coupled to even data line shield transistors, the method further comprising applying a disable voltage to control gates of the even data line shield transistors such that the even data lines are not operably coupled to a shield voltage line.

12. The method of claim 11, wherein the second alternating data lines are odd data lines that are coupled to odd data line shield transistors, the method further comprising applying an enable voltage to control gates of the odd data line shield transistors such that the odd data lines are coupled to the shield voltage line.

13. The method of claim 12, further comprising applying an enable voltage to sense transistors that are coupled to the even data lines.

14. The method of claim 13, further comprising latching sensed data from the even data lines into page buffers.

15. A method comprising:
    applying a programming voltage to a selected access line of a plurality of access lines to program a selected memory cell in a first string of memory cells;
    applying a program pass voltage to unselected access lines of the plurality of access lines to disable unselected memory cells;
    applying page buffer data to a first data line, of a plurality of vertically stacked alternating data lines, operably coupled to the first string of memory cells;
    applying a shield voltage to adjacent data lines, of the plurality of vertically stacked alternating data lines, that are adjacent to the first data line and on either side of the first data line, the adjacent data lines coupled to unselected strings of memory cells;

applying an enable voltage to select gate drain transistors to operably couple the first string of memory cells to the first data line; and applying a disable voltage to select gate drain transistors that couple the unselected strings of memory cells to the adjacent data lines.

16. The method of claim 15, further comprising applying a disable voltage to control gates of select gate source transistors.

17. The method of claim 16, further comprising applying a positive voltage to a source line coupled to the select gate source transistors.

18. The method of claim 15, wherein applying the page buffer data to the first data line comprises enabling programming transistors coupled between the page buffer and the first data line.

19. The method of claim 15, wherein the first data line is one of a plurality of even data lines alternating with a plurality of odd data lines of the plurality of vertically stacked alternating data lines.

20. The method of claim 19, wherein the even data lines are selected during programming of the selected memory cell and the odd data lines are unselected during the programming of the selected memory cell.

* * * * *